(12) United States Patent
Lee et al.

(10) Patent No.: US 7,337,535 B2
(45) Date of Patent: *Mar. 4, 2008

(54) HOLE PLUGGING METHOD FOR PRINTED CIRCUIT BOARDS, AND HOLE PLUGGING DEVICE

(75) Inventors: Sung Gue Lee, Osan (KR); Sung Sik Cho, Osan (KR); Yong Il Kim, Osan (KR); Yong Soon Jang, Osan (KR); Ho Sung Choi, Osan (KR); Sang Jin Kong, Osan (KR); Young Hwan Kim, Osan (KR)

(73) Assignee: LG Electronics Inc., Seoul (KR)

( * ) Notice: Subject to any disclaimer, the term of this patent is extended or adjusted under 35 U.S.C. 154(b) by 329 days.

This patent is subject to a terminal disclaimer.

(21) Appl. No.: 10/773,267

(22) Filed: Feb. 9, 2004

(65) Prior Publication Data

US 2004/0154166 A1 Aug. 12, 2004

Related U.S. Application Data

(62) Division of application No. 10/043,146, filed on Jan. 14, 2002, now Pat. No. 6,954,985.

(30) Foreign Application Priority Data

Jun. 7, 2001 (KR) ............................ 2001-31752
Aug. 27, 2001 (KR) ............................ 2001-51853

(51) Int. Cl.
*H01R 43/00* (2006.01)
(52) U.S. Cl. ........................... 29/825; 29/846; 29/852; 29/853

(58) Field of Classification Search .................. 29/829, 29/830, 831, 846, 852, 853, 825
See application file for complete search history.

(56) References Cited

U.S. PATENT DOCUMENTS 4,715,117 A * 12/1987 Enomoto ..................... 29/851
4,728,568 A    3/1988 Sasada et al.
5,090,120 A *  2/1992 Matsumoto .................. 29/846

(Continued)

FOREIGN PATENT DOCUMENTS

JP         03-049293      * 3/1991

(Continued)

*Primary Examiner*—Carl J. Arbes
(74) *Attorney, Agent, or Firm*—Birch, Stewart, Kolasch & Birch, LLP

(57) ABSTRACT

A hole plugging method for a printed circuit board, a hole plugging device in accordance therewith and a manufacturing method in accordance therewith where a mask for selectively exposing a via hole, a through hole and a surface pattern of the printed circuit board is positioned on the board having the via hole and the through hole to electrically connect circuit patterns formed on the surface of the board and in the board and an insulating material is plugged in the via hole by abutting and pushing the material on the surface of the board. Therefore, the insulating material can be plugged smoothly without a void, the processing is simplified by plugging the insulating material just to the height of the circuit pattern in a space between the circuit patterns and accordingly, damage to the circuit pattern can be prevented.

18 Claims, 6 Drawing Sheets

U.S. PATENT DOCUMENTS

| | | | |
|---|---|---|---|
| 5,268,194 A * | 12/1993 | Kawakami et al. | 427/98.2 |
| 6,272,745 B1 * | 8/2001 | Kersten et al. | 29/852 |
| 6,276,055 B1 * | 8/2001 | Bryan et al. | 29/852 |
| 6,340,841 B2 * | 1/2002 | Iijima et al. | 257/700 |
| 6,631,838 B2 * | 10/2003 | Kim et al. | 228/225 |
| 6,768,064 B2 * | 7/2004 | Higuchi et al. | 174/267 |
| 6,954,985 B2 * | 10/2005 | Lee et al. | 29/852 |

FOREIGN PATENT DOCUMENTS

| | | | |
|---|---|---|---|
| JP | 7-86727 A | | 3/1995 |
| JP | 7-162132 A | | 6/1995 |
| JP | 10-215066 | * | 8/1998 |
| JP | 11-145592 A | | 5/1999 |
| JP | 2000-261140 A | | 9/2000 |
| JP | 2000-353878 A | | 12/2000 |
| WO | WO 01/31982 A1 | | 5/2001 |

* cited by examiner

HOLE PLUGGING METHOD FOR PRINTED CIRCUIT BOARDS, AND HOLE PLUGGING DEVICE

The present application is a divisional of U.S. patent application Ser. No. 10/043,146 filed on Jan. 14, 2002 now U.S. Pat. No. 6,954,985 for which priority is claimed under 35 U.S.C. § 120. This application also claims priority under 35 U.S.C. § 119(a) on Patent Application No. 31752/2001 filed in Korea on Jun. 7, 2001 and Patent Application No. 51853/2001 filed in Korea on Aug. 27, 2001. The entire contents of each of these applications are herein fully incorporated by reference.

BACKGROUND OF THE INVENTION

1. Field of the Invention

The present invention relates to a hole plugging method for printed circuit boards, a hole plugging device which carries out such method and a manufacturing method in accordance, and particularly, to a hole plugging method for printed circuit board and to a hole plugging device and a manufacturing method in accordance therewith which plugs holes in a printed circuit board with an insulating resin or solder resist by abutting a squeegee or doctor blade to an exposed hole using a mask capable of exposing a certain portion of a board or plugs resin or solder resist between circuit patterns with.

2. Description of the Background Art

Recently, integrated circuits (IC) have become more densified by an increase in the degree of integration according to the development of technology. Accordingly, it is required that a printed circuit board for mounting ICs become more densified.

For meeting this necessity, currently, the printed circuit board is densified by fabricating a multi layer (printed circuit) board formed with a plurality of layers. In the multi layer board 1, open through holes 1d and via blind holes 1c may be form in the board wherein a conductive layer 1e is coated in the holes 1c and 1d to electrically interconnect circuit patterns 1a and 1b of one or more an inner layers and/or the surface layers, with reference to FIG. 1A.

The through hole 1d has a relatively large diameter than the via hole 1c and is typically formed by employing a mechanical process such as by drilling. However, the interval between the through holes 1d can not be narrowed beyond a certain spacing and there is thus a limitation in the densification degree of the board when the sizes of tools and avoidance of damage to the board 1 in the processing are taken into consideration.

Based on the above characteristics, in the case of forming a via hole 1c with a small diameter by employing a chemical method such as by etching, the interval between adjacent via holes 1c can be made narrower than that between the through holes 1d, and a circuit pattern can be formed at the portion adjacent the via hole 1c and the upper side of the via hole 1c, thus to achieve higher integration and miniaturization of the printed circuit board.

Such a via hole 1c has a conductive layer 1e and is coated with a solder resist using a screen printing process or a roller coating process to protect the conductive layer 1e from external impact and to prevent foreign materials from attaching to the conductive layer 1e.

First, the conventional hole plugging method of the printed circuit board using the screen printing process will be described with reference to FIGS. 1A and 1B.

The structure of the printed circuit board includes circuit patterns (surface circuits patterns) 1a positioned on both the upper and lower surfaces of the board 1 and circuit patterns (internal circuits) 1b positioned in the inner layers of the board.

On the board 1, a via holes 1c is formed to electrically interconnect the surface circuit pattern 1a and internal circuit 1b through the conductive layer 1e, and the through hole 1d is formed to electrically interconnect both the upper and lower surface circuit patterns 1a through the conductive layer 1e.

In the hole plugging method of the printed circuit board using the screen printing technique, the board 1 is positioned on a jig (not shown) and a screen 2 such as a mesh is positioned at the upper side thereof at a certain distance.

Then, after coating solder resist (SR) on the upper surface of the screen 2, the solder resist (SR) is discharged through an opening 2a in the screen 2 by pushing a squeegee 3 in the direction of the arrow in the drawing and then is filled in the via hole 1c and through hole 1d of the board 1.

In the above screen printing technique, the screen 2 is formed in the form of a mesh by weaving a plurality of fine wires 2b crossing each other. The wire diameter of a #110 screen is approximately 0.08 mm and the wire diameter of a #600 screen is approximately 0.045 mm. As shown in FIG. 1B, if that the diameter of the subminiature via hole is 0.1 to 0.15 mm, in the portion where the fine wires intersect, part of the via hole 1c is covered since the diameter of the conventional fine wire 2b is half that of the via hole 1c.

Particularly, a considerable portion of the via hole 1c where the fine wires 2b cross each other is covered and accordingly, the solder resist (SR) cannot be plugged sufficiently.

Also, the solder resist (SR) is coated in the space 1f between the surface circuit pattern 1a and the screen 2 since the solder resist SR is coated by using the screen 2. However, removing the solder resist SR afterwards by an abrasive process to expose the surface circuit pattern 1a is not easy since the solder resist SR is coated covering the surface circuit pattern 1a completely and damages may result to the surface circuit pattern 1a in case of removing the solder resist SR by using a brush and the like.

Second, the conventional hole plugging method of the printed circuit board using the roller coating technique will be described with reference to FIGS. 2A and 2B.

In the hole plugging method using the roller coating after supplying the solder resist SR to an upper roller 4a and lower roller 4b, the solder resist SR at the rollers 4a and 4b is transferred to the board 1 and coated by passing the board 1 between rollers 4a and 4b at the both side thereof.

In the conventional roller coating method, the solder resist SR is coated by putting the solder resist SR in a groove (not shown) formed on the circumferential surface of the rollers 4a and 4b, but in case a projecting portion 5 with relatively small amount of solder resist SR is abutted to the via hole 1c or blocks up the via hole 1c, a sufficient amount of solder resist SR can not be plugged.

In the screen printing method, the solder resist SR is coated in the via hole 1c or the through hole 1d of the board 1 by pushing the solder resist SR coated on the screen 2 after putting the screen 2 on the board 1. In the roller coating method, the solder resist SR on the rollers 4a and 4b is flowed and coated on the via hole 1c and the through hole 1d of the board 1. Air bubbles remaining behind in the solder resist SR are discharged due to the high heat when the integrated circuit (not shown) is mounted, and accordingly the circumferential circuit patterns, solder resist and integrated circuit can be damaged even though the solder resist SR is filled in the via hole 1c and the through hole 1d. Also, the coefficients of thermal expansion of the integrated circuit and the board are different and accordingly, the board can be damaged when high heat is generated in the integrated circuit.

To solve the above problems, the present applicant had filed an earlier application for "A Method for Fabricating a Printed Circuit Board using Vacuum" (Korea Patent Application No. 2000-19045) on Apr. 11, 2000 and also an application for US Letters patent therefore, under U.S. patent application Ser. No. 09/832,122.

In the above fabrication method, the solder resist is coated on the via hole of the board, and at the same time air in the via hole is discharged to the outside and the solder resist is plugged in the via hole. The solder resist can be plugged in the via hole efficiently by completely removing the residual air bubbles in the via hole. However, there are disadvantages in the cost and the manufacturing time, in that a vacuum device must be equipped and repeated operation of exposure under the vacuum condition and plugging operations are needed thus to reduce productivity.

SUMMARY OF THE INVENTION

Therefore, an object of the present invention is to provide a hole plugging method for printed circuit boards and a hole plugging device in accordance therewith, capable of smoothly plugging a solder resist insulating material in a via hole formed to electrically connect a circuit pattern formed on the surface of the board and a circuit pattern formed in the board, or in a through hole formed to electrically connect the circuit patterns on the both side surfaces of the board.

Another object of the present invention is to provide a hole plugging method for printed circuit boards and a hole plugging device in accordance therewith capable of plugging a resin insulating material by coating the resin in spaces between the circuit patterns just to the height of the circuit patterns and at the same time, minimizing the amount of insulating material coated on the circuit pattern.

Still another object of the present invention is to provide a hole plugging method for printed circuit boards and a hole plugging device in accordance therewith capable of preventing bubbles from remaining behind in the insulating material plugged in the spaces between via holes, through holes or circuit patterns on the board.

Still another object of the invention is to provide a hole plugging method for printed circuit boards and a hole plugging device in accordance therewith capable of preventing an integrated circuit on the board from being damaged by restraining the formation of residual bubbles in the insulating material in the spaces between the via holes, through holes or circuit patterns on the board sufficiently.

To achieve these and other advantages and in accordance with the purpose of the present invention, as embodied and broadly described herein, there is provided a hole plugging method for printed circuit boards in which an insulating material is plugged in a via hole by abutting a squeegee for plugging an insulating material in the via hole directly to a surface of a board where the via hole is formed to electrically connect a circuit pattern formed on the surface of the board and a circuit pattern formed in the board.

Also, to achieve the above object, there is provided a hole plugging method for printed circuit boards, wherein an insulating material is plugged in exposed via holes by positioning a mask for selectively exposing the via holes on the board where the via hole is formed to connect a circuit pattern formed on the surface of the board and a circuit pattern formed in the board electrically.

Also, to achieve the above object, the hole plugging method for the printed circuit boards in accordance with the present invention pushes and plugs the insulating material into the spaces between the circuit patterns by abutting the squeegee for plugging the insulating material in the spaces between the circuit patterns formed on the surface of the board to the surface of the board and the circuit patterns.

Also, to achieve the above object, in the hole plugging method for the printed circuit boards, a mask for selectively exposing the insulating material in the spaces between the circuit patterns to plug the insulating material in the spaces among the circuit patterns formed on the surface of the board is positioned on the board and the insulating material is plugged only in the spaces between the exposed circuit patterns.

To achieve the above object, the hole plugging method for the printed circuit boards in accordance with the present invention includes the steps of providing the mask exposing the via hole and covering another portion on the board, the board having the via hole for connecting the circuit pattern to connect the circuit pattern formed on the surface of the board and the circuit pattern formed in the board electrically, positioning the mask on the board and plugging the insulating material in the via hole or in the spaces between the surface circuit patterns by coating the insulating material on the portion of the board exposed by the mask.

Also, to achieve the above object, the hole plugging method for the printed circuit boards in accordance with the present invention includes the steps of providing the mask exposing the via hole and covering another portion on the board, the board having the via hole for electrically connecting the circuit pattern formed on the surface of the board and the circuit pattern formed in the board and the through hole for electrically connecting the circuit patterns of the both side surfaces, positioning the mask on the board and plugging the insulating material in the via hole by coating the insulating material on the portion of the board exposed by the mask.

To achieve the above object, the hole plugging device for the printed circuit boards in accordance with the present invention includes a mask positioned on the board where the via hole is formed to connect the circuit pattern formed on the surface of the board and the circuit pattern formed in the board electrically, and a pressing means for plugging the insulating material in the via hole by coating the insulating material on the surface of the board exposed by the mask.

On the other hand, to achieve the above object, in the hole plugging method for the printed circuit boards in accordance with the present invention, solder resist or insulating resin is filled in the spaces between surface side circuit patterns by moving the squeegee under the condition of being abutted on the upper surface of the circuit pattern on the surface of the printed circuit board, the board having a plurality of circuit patterns formed thereon and formed in the board and a hole for electrically connecting the circuit pattern formed on the surface of the board and the circuit pattern formed in the board or for connecting the circuit patterns on the both side surfaces and by moving the squeegee being abutted to the surface of the printed circuit board.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
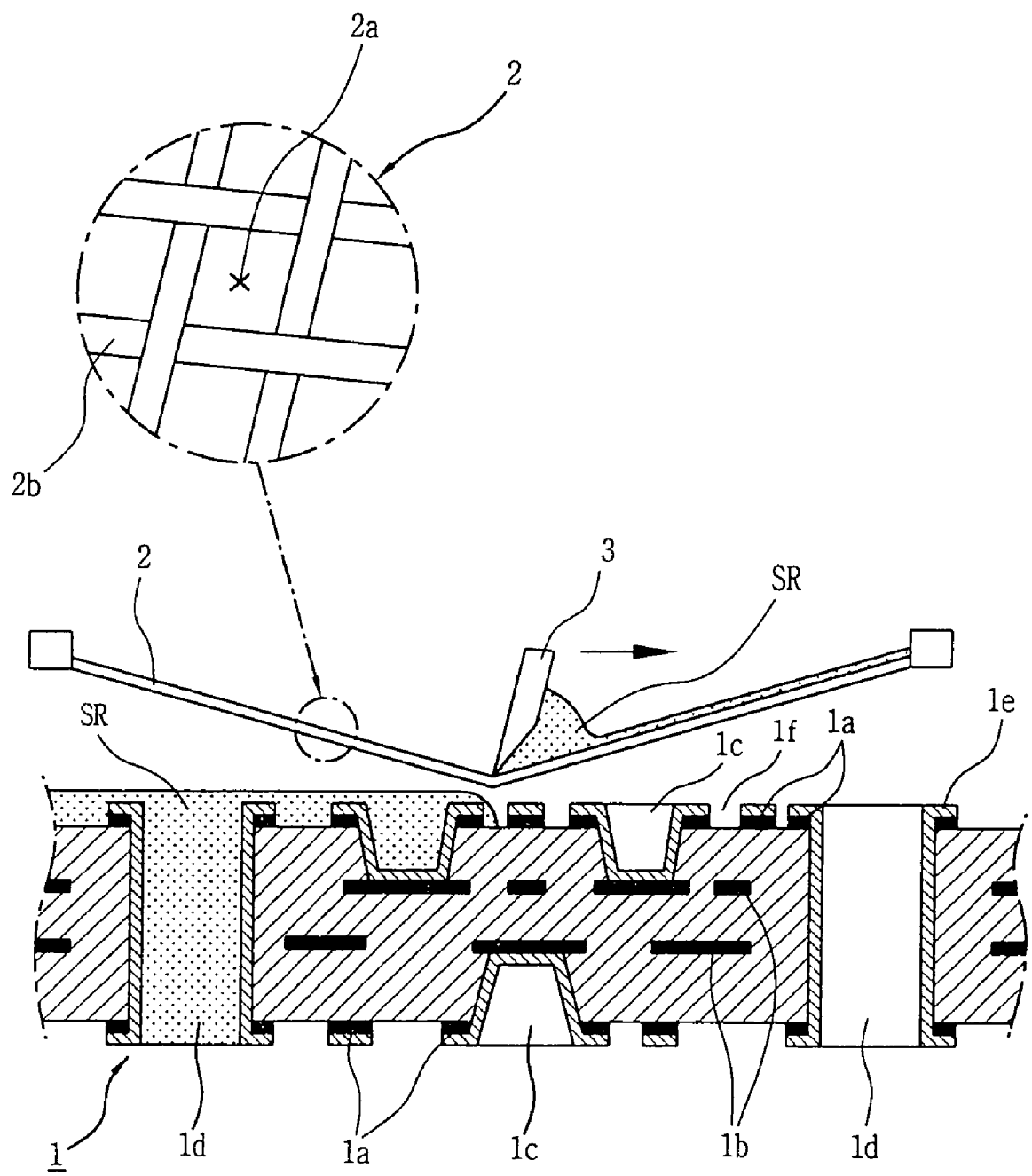
FIG. 1A is a cross-sectional view showing a hole plugging method for printed circuit boards using a conventional screen printing method.
Figure 1B:
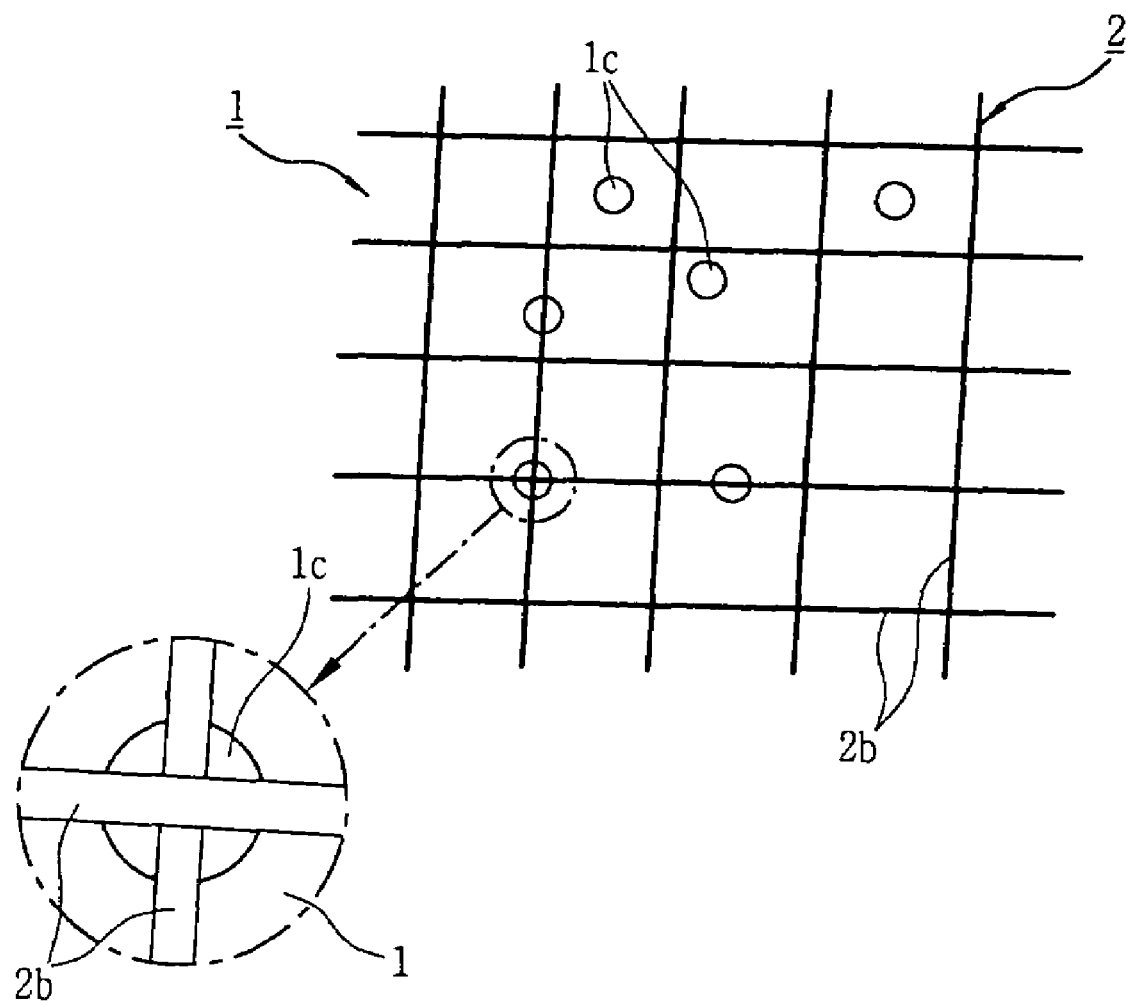
FIG. 1B is a plan view briefly showing a hole plugging process for printed circuit boards using the conventional screen printing method.
Figure 2A:
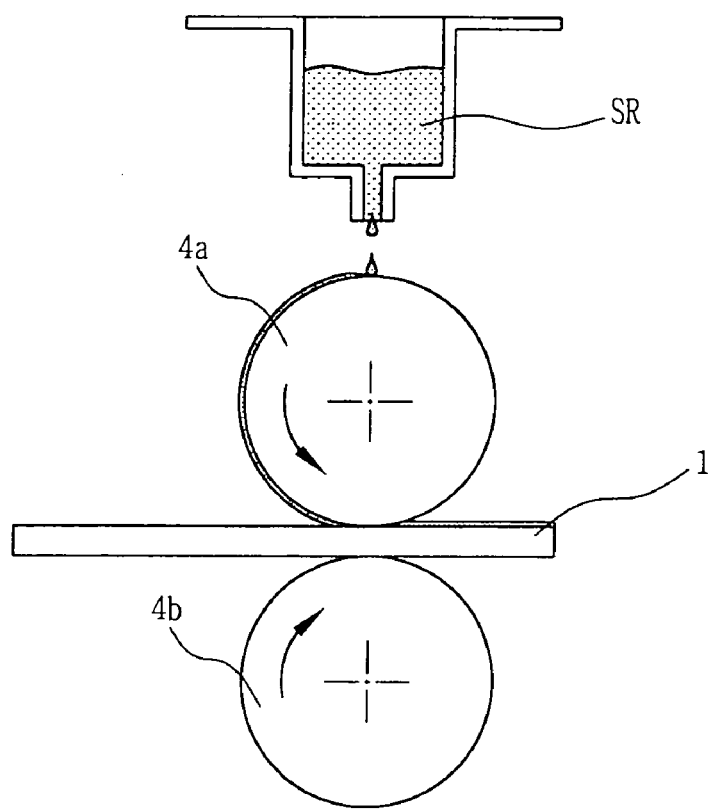
FIG. 2A is a cross-sectional view briefly showing the hole plugging for printed circuit boards using a conventional roller coating method.
Figure 2B:
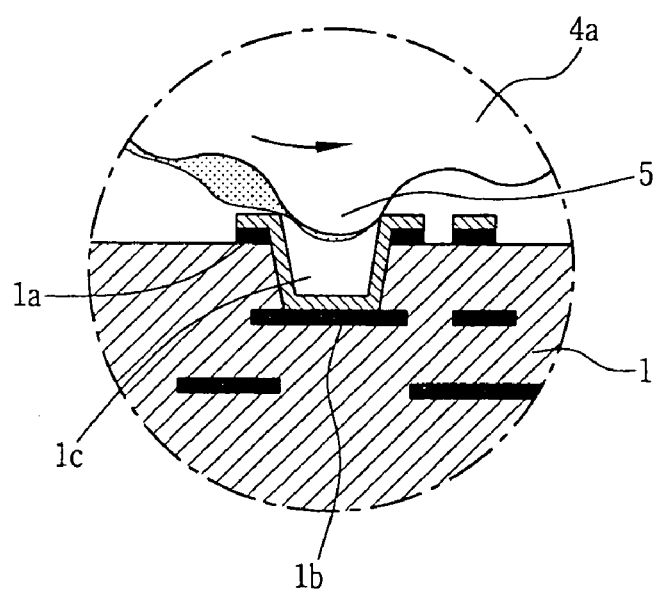
FIG. 2B is an enlarged cross-sectional view showing the hole plugging process for the printed circuit boards using the conventional roller coating method.
Figure 3:
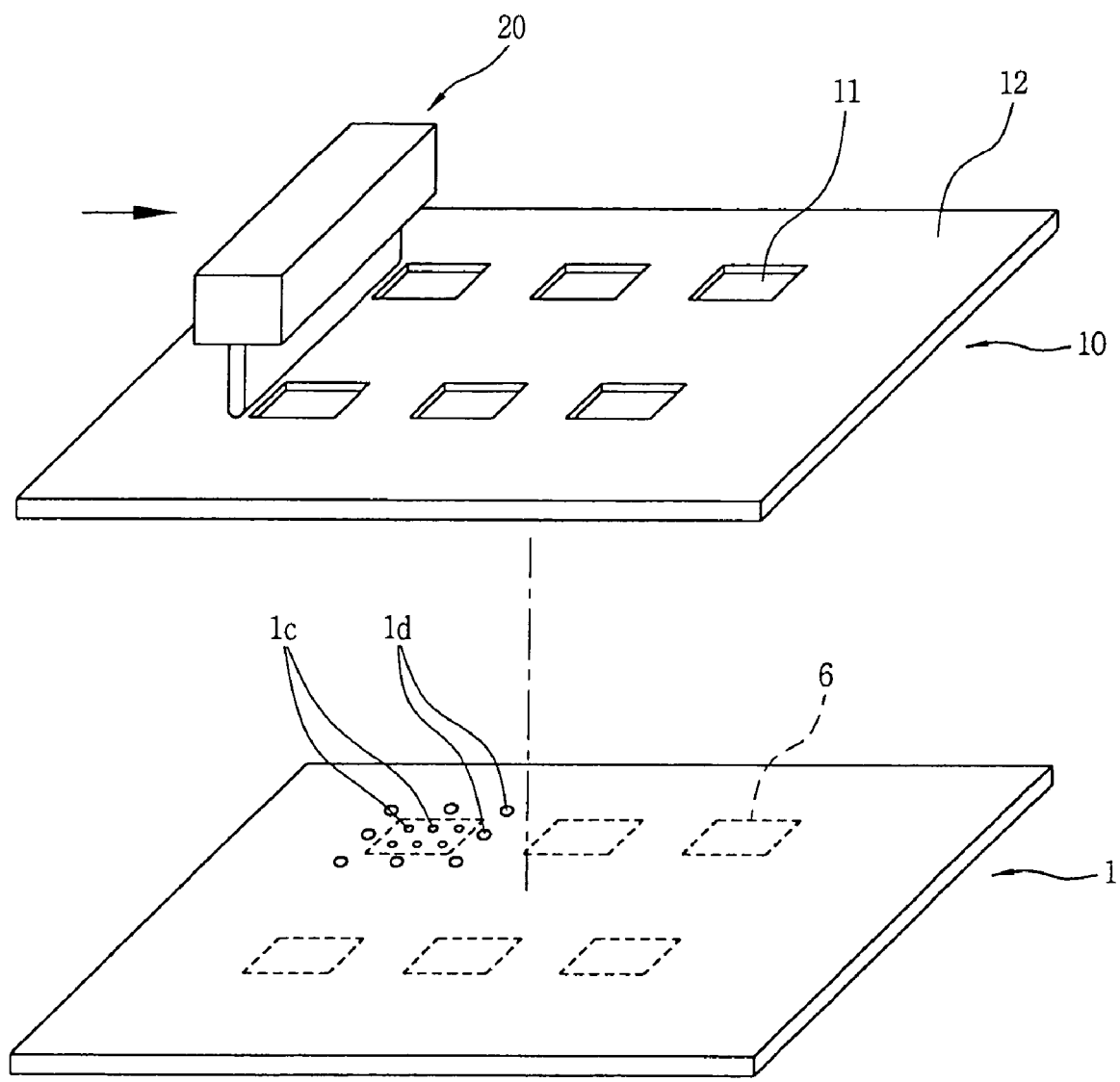
FIG. 3 is a perspective view showing a hole plugging device for printed circuit boards according to an embodiment of the present invention.
Figure 4:
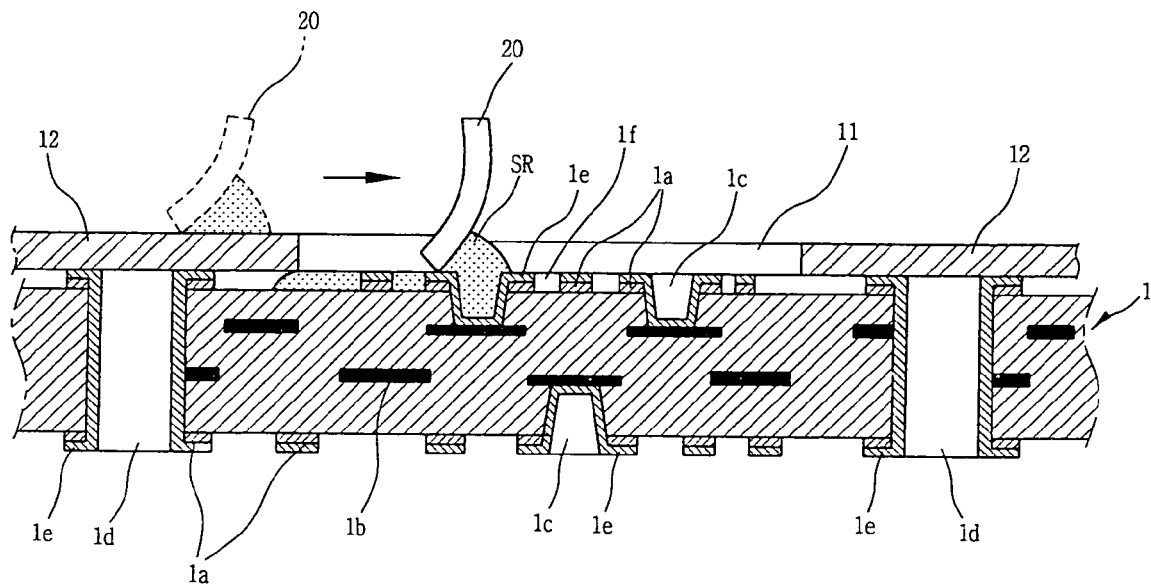
FIG. 4 is a cross-sectional view showing the hole plugging device and method for printed circuit boards according to the embodiment of the present invention.
Figure 5:
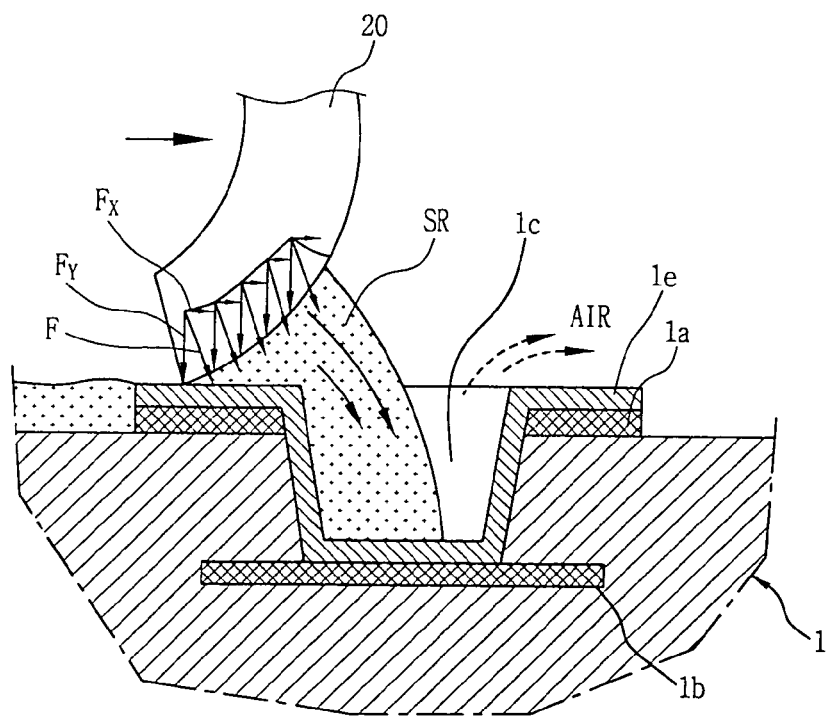
FIG. 5 is a detail view showing a state where a hole is plugged in a printed circuit board according to the embodiment of the present invention.

FIG. 3 is a perspective view showing a hole plugging device for printed circuit boards according to an embodiment of the present invention, FIG. 4 is a cross-sectional view showing the hole plugging device and method for printed circuit boards according to the embodiment of the present invention and FIG. 5 is a detail view showing a state where a hole is plugged in a printed circuit board according to the embodiment of the present invention.

Firstly, the printed circuit board includes a surface circuit pattern 1a and internal circuit conductors 1b are formed on and in a board 1 respectively, a via hole 1c formed to electrically connect the surface circuit pattern 1a and the internal circuit pattern 1b by a conductive layer 1e, and a through hole 1d formed to connect the both side surface circuit patterns 1a by the conductive layer 1e.

The hole plugging device for a printed circuit board in accordance with the present invention includes a mask 10 wherein a opening portion 11 is formed to selectively expose the via holes 1c, through holes 1d and the surface circuit patterns 1a under the condition of being positioned on the board 1 and a squeegee 20 which serves as a pressing implement, by being directly abutted on the exposed part of the board 1 exposed by the mask 10 to coat a resin or solder resist SR thereon, which are insulating materials.

It is desirable that the mask 10 is made of a metal material having a certain extent of tension to correspond to stress generated when the squeegee 20 is given pressure, but the mask can be formed with a mixed material of a fibrous material and a resinous material or of a film type member.

Also, the mask 10 includes an opening portion or portions 11 formed by cutting away portions thereof corresponding in location to areas to be exposed on the board 1 among the via holes 1c and the through holes 1d of the board 1, as with a laser and the like, and a masking portion 12 which does not expose the board 1.

The process of plugging resin or solder resist in the via holes and the through holes of the printed circuit board using the hole plugging device in accordance with the present invention will be described as follows.

As shown in FIG. 4, in case the board has a circuit pattern as a four layer structure by independently forming the surface circuit patterns 1a on the both upper and lower surfaces of the board 1 and forming the internal circuits 1b in the board 1 as a two layer structure, the surface of the conductive layer 1e is coated with resin or solder resist to protect the conductive layer 1e since the via hole 1c and the through hole 1d have the conductive layers 1e which are metal layers to conduct electricity.

The mask 10 is positioned by having the opening portion 11 in the mask 10 correspond to the via hole 1c to expose the via hole 1c of the board 1.

The element designated by reference numeral 6 and indicated with dotted lines in FIG. 3 is a circuit area of the board 1 corresponding to the opening portion 11. Therefore, the via hole 1c of the circuit area 6 is exposed by the opening portion 11 and the other areas on the board 1 are masked by the masking portion 12.

Next, when the squeegee 20 is lowered and the squeegee is abutted on the mask 10 and if the squeegee is pressed down more, the squeegee 20 is abutted on the mask and through opening 11 as the end of the blade of the squeegee is bent.

The resin or solder resist SR is plugged in the via hole 1c by moving the squeegee 20 in the direction of the arrow as shown in FIG. 4.

Namely, as the lower end of the blade of squeegee 20 passes over the surface of the masking portion 12 of the mask 10, the squeegee 20 pushes the resin or solder resist SR positioned on the surface. Then, as the squeegee 20 is progressed while being abutted on the upper surface of the board 1 by positioned at the opening portion 11 of the mask 10, the squeegee plugs the resin or resister SR into the via hole 1c by pushing the resin or solder resist SR while being positioned on the board 1.

At this time, as shown in FIG. 5, the resin or solder resist SR is consequently filled from the left side to right side of the via hole 1c by the resultant force F of vertical component force $F_y$ and horizontal component force $F_x$ of the squeegee 20, directed in the downward direction since the squeegee 20 is abutted on the surface of the board 1 under the condition that the end portion of the blade thereof is bent. The air in the via hole 1c is displaced as the squeegee forcefully pushes the resin or solder resist SR and is removed as shown in the drawing.

Next, after the plugging processing of the resin or solder resist SR into the via hole 1c, the mask 10 is removed and the resin or solder resist SR is plugged into the through holes 1d. As described above, because the through holes 1d have a larger diameter than the via holes 1c, accordingly the resin or solder resist SR can be smoothly plugged into the through holes using the conventional above described screen printing method or roller coating method.

Then, light is irradiated onto the board 1 under the condition that the mask 10 capable of exposing the via hole 1c and the through hole 1d is positioned on the upper surface of the board 1 where the resin or solder resist SR is coated and thereby only the exposed portion of the resin or solder resist SR is hardened. The mask 10 is taken away and the printed circuit board is completed by performing a series of post operations for grinding the board 1 with a grinder (not shown) after developing and removing the solder resist SR which is not hardened.

On the other hand, the through hole 1d can also be filled with the resin or solder resist SR by using a mask (not shown) manufactured to expose only the through hole 1d, as in the earlier procedure exposing only the via hole 1c. At this time, it is desirable that the resin or solder resist SR is plugged by abutting the squeegee 20 on the upper surface of the board 1 pushing the resin or solder resist SR.

The screen printing method of positioning a wire woven mesh sieve between the squeegee 20 and the board 1 to plugging holes by positioning the screen having the resin or solder resist or the roller coating method for passing the board between rollers covered with resin or solder resist can also be used for plugging the through holes.

In case of additionally using the mask 10 capable of exposing the through hole 1, wastage of the resin or solder resist SR in mass production of the printed circuit board can be prevented by blocking the resin or solder resist SR using the mask at the portion of the board where the resin or solder resist SR is not needed to be coated such as in between the via hole 1c and the through hole 1d.

The hole plugging method of the printed circuit board in accordance with the present invention will be described with reference to FIGS. 6 and 7.

In the above embodiment, the resin or solder resist was filled in the via hole or through hole using the squeegee one time but in the following embodiment, the resin or solder resist can be sufficiently plugged in the hole by moving the squeegee at least two times, in case the resin or solder resist is not completely plugged in the hole due to the via hole having a small diameter and a large depth, even though the squeegee is moved one time.

Figure 6:
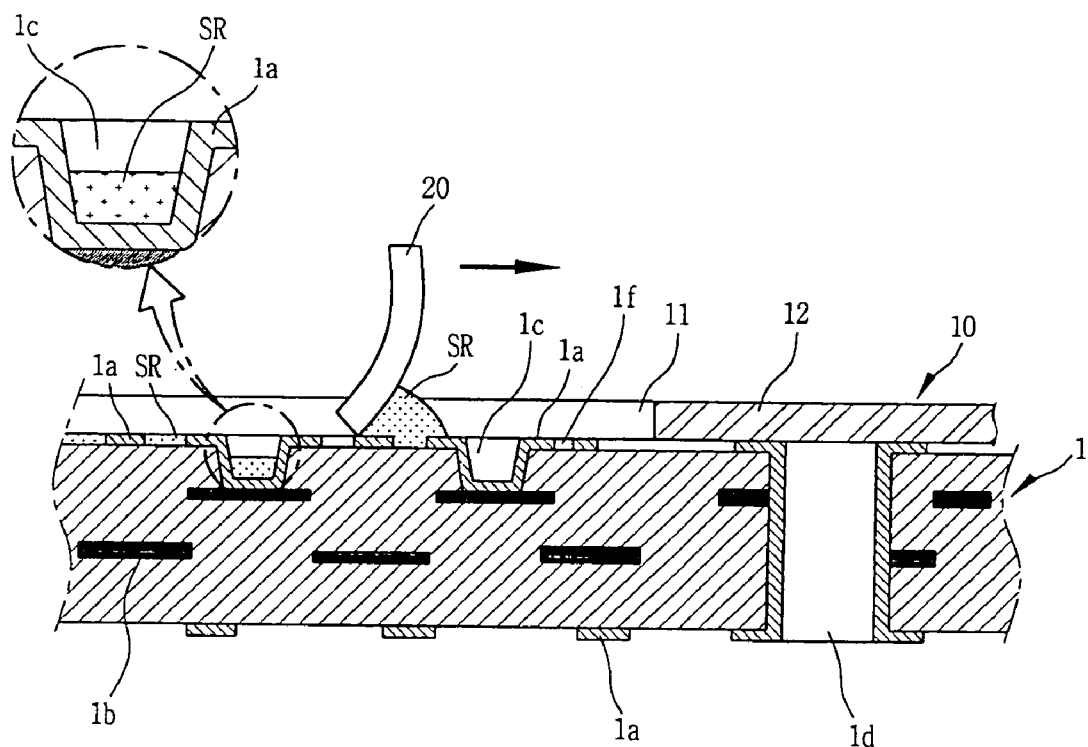
FIG. 6 is a cross-sectional view showing the hole plugging method for printed circuit boards according to another embodiment of the present invention.

Namely, as shown in FIG. 6, after positioning the mask 10 for dividing the areas where the resin or solder resist SR is to be coated or not coated on the printed circuit board 1, when the squeegee 20 is directly abutted onto the surface of the printed circuit board 1 as the squeegee 20 is bent a little by virtue of its elasticity and is thereby abutted directly on the upper surface of the surface side circuit pattern 1a.

Then, as shown in FIG. 6, when a first plugging step is performed by moving the squeegee 20 in the direction of the arrow after coating the resin or solder resist SR on the surface of the printed circuit board 1, the resin or solder resist SR is coated and filled in the spaces between the surface side circuit patterns 1a.

At this time, as the squeegee 20 is moved in constant abutted relation to the circuit patterns 1a, the height of the coated resin or solder resist SR plugged in the spaces 1f between surface side circuit pattern 1a is not protruded higher than the upper surface of the circuit pattern. At this time, in case the entrance side diameter of the via hole 1c is small and the depth is about three times or more deeper than the thickness of the surface side circuit pattern 1a, the resin or solder resist SR may not be sufficiently plugged in the via hole 1c, and only about a half of the hole depth is plugged as shown in FIG. 6.

Figure 7:
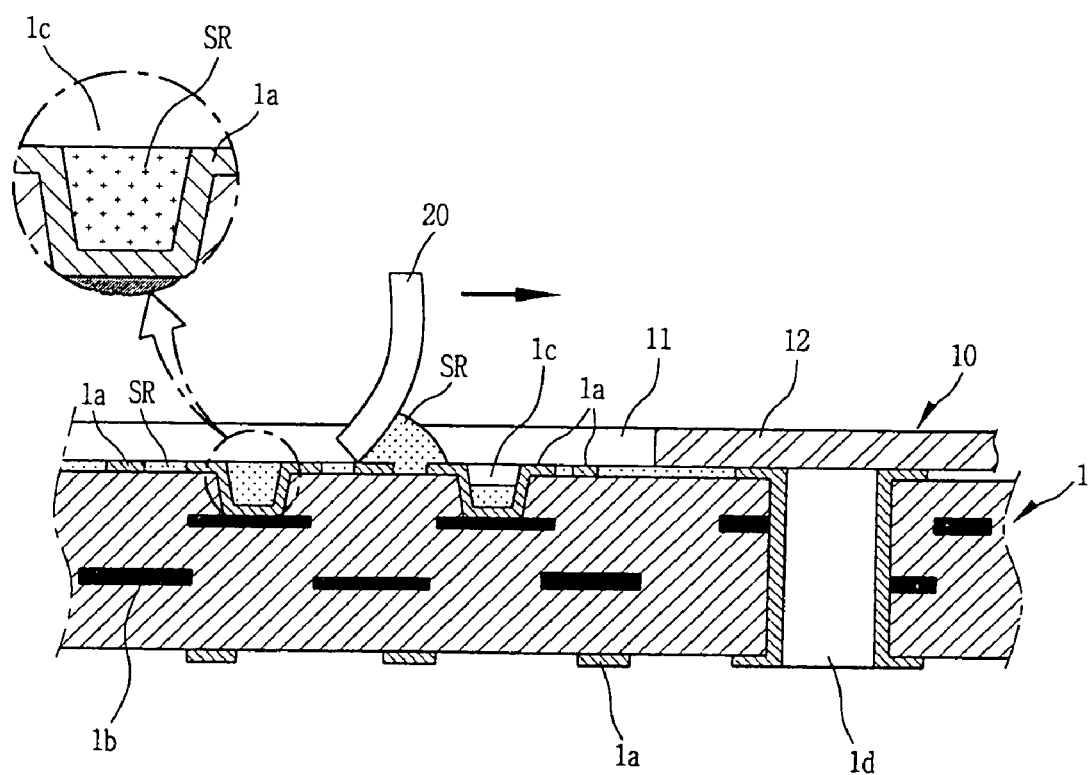
FIG. 7 is a cross-sectional view showing the hole plugging method for printed circuit boards according to another embodiment of the present invention.

Later, as shown in FIG. 7, after re-positioning the squeegee 20 back to the original position, the squeegee 20 is moved to the position as in the first plugging step or moved in the opposite direction to that of the first plugging step and the resin or solder resist SR is completely plugged in the via hole 1c by coating the resin or solder resist one more time.

Then, after removing the mask 10, the resin or solder resist SR is plugged in the through hole 1d as done conventionally, or the resin or solder resist SR is additionally coated on the upper portion of the surface side circuit pattern 1a and the via hole 1c at the same time as the resin or solder resist SR is plugged in the through hole 1d to protect the exposed circuit pattern 1c. Then, drying and grinding processes are performed.

On the other hand, in the step of plugging the via hole operated in two steps, a step of removing air bubbles contained in the resin or solder resist by exposing the printed circuit board under a vacuum condition in the middle of each of the plugging steps can be performed additionally.

In still another embodiment of the present invention, the resin or solder resist SR can be plugged in the through hole after plugging the resin or solder resist in the via hole as in the above embodiment, but the resin or resister SR can be plugged later in the via hole after plugging the resin or solder resist in the through hole.

Namely, the resin or resister is plugged in the through hole using a silk screen under the condition of exposing the circumferential through hole after masking the via hole formed at the center portion of the printed circuit board and then the resin or solder resist can be plugged without additional masking after removing the mask.

Here, since the squeegee is not abutted on the surface of the printed circuit board in plugging in the through hole, the resin or solder resist is risen around the hole convexly. It is desirable that the resin or solder resist is formed as a flat surface through a flattening processing performed before or after plugging the via hole.

Since the resin or solder resist can be plugged in the via hole or the through hole using the squeegee directly abutted to the board, the resin or solder resist can be plugged in each hole sufficiently and residual air bubbles can be restrained without performing complicated processing such as the vacuum process.

Therefore, damage to the integrated circuit and printed circuit board caused by the air bubbles in mounting or operating the integrated circuit can be prevented and accordingly, reliability can be improved and manufacturing time of the printed circuit board can be reduced, thus to improve productivity.

Particularly, in case the resin or solder resist is coated on the via hole with a small diameter using the screen printing method or the roller coating method, the resin or solder resist is not sufficiently filled since the via hole is covered by the thickness of the screen or the protruded portion of the roller, but in the present invention, the resin or solder resist can be sufficiently filled in each via hole since the resin or solder resist is plugged by directly abutting the squeegee on the board.

Also, air in the resin or solder resist can be prevented from remaining behind in the hole and the hole and the space in between the circuit patterns by a processing can be plugged at the same time since the resin or solder resist is coated by fixedly-abutting the squeegee to the printed circuit board.

Also, the width and interval of the printed circuit board in accordance with the present invention can be precisely controlled by performing two dimensional gold plating to perform gold plating only on the upper side in plating gold on the pad terminals of the circuit pattern in the wire bonding processing for connecting the circuit pattern of the chip and the printed circuit board by wires in the packaging operation to mount the chip.

In addition, in each embodiment of the present invention, although an insulating material to be plugged was described as limited to the resin or solder resist SR, the descriptions above are just examples and general epoxy resin and solder paste can be used as the insulating material and more generally, materials having viscoelasticity and commonly used in manufacturing the printed circuit board can be used.

As described above, the hole plugging method for the printed circuit boards, and the hole plugging device in accordance therewith can easily plug the insulating material in holes with small diameters and in advance prevent air bubbles from remaining behind in the plugging process by plugging the insulating material in the via hole or through hole by abutting the squeegee on the exposed portion after positioning the mask capable of selectively exposing the portion where the insulating material is to be coated on the board having the via hole and the through hole on the board, thus to prevent damage to the integrated circuit and the board caused by the air bubbles in mounting or operating the integrated circuit.

Also, other portions other than the circumference of the via hole or the through hole are not coated by the resin or solder resist which is an insulating material and accordingly, waste of the insulating material can be prevented in mass production.

In case the grinding processing is performed to flatten the surface of the board, since the resin or solder resist SR is not coated at the upper surface of the surface circuit pattern 1a or the amount or coated thickness is small, the grinding process is eased and damage to the surface circuit pattern 1a caused by the grinding processing can be minimized.

Also, the present invention can enable forming the width and interval precisely by performing two dimensional gold plating by which the upper surface of the pad is plated by gold when gold plating of the pad terminal in the circuit pattern is performed.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A plugging method for a printed circuit board having a plurality of circuit patterns formed on a surface of the board, comprising the step of:
   filling a solder resist or resin in a via hole or a through hole formed between two adjacent circuit patterns by moving a squeegee to directly contact an upper surface of at least one of the two adjacent circuit patterns.

2. A method for manufacturing a printed circuit board having a plurality of first circuit patterns formed on a surface of the board and a plurality of second circuit patterns formed within the board, and a plurality of via holes for electrically connecting the first circuit patterns and the corresponding second circuit patterns, comprising the step of:
   filling a solder resist or resin in at least one of the via holes by moving a squeegee to directly contact an upper surface of at least one of the first circuit patterns corresponding to the at least one of the via holes.

3. The method of claim 1, wherein the step of filling the solder resister or resin comprises;
   a first step of plugging the solder resist or resin in one portion of the via hole or the through hole by moving the squeegee to be abutted on the upper surface of the at least one of the two adjacent circuit patterns; and
   a second step of completely plugging the solder resist or resin in the whole portion of the via hole or the through hole by moving the squeegee to be abutted on the upper surface of the at least one of the two adjacent circuit patterns.

4. The method of claim 3, wherein in the second plugging step the solder resist or resin is plugged in the via hole or the through hole by moving the squeegee in an opposite direction to a moving direction of the squeegee in the first plugging step.

5. The method of claim 3, wherein in the second plugging step the solder resist or resin is plugged in the via hole or the through hole by moving the squeegee in a same direction to a moving direction of the squeegee in the first plugging step.

6. The method of claim 1, wherein the solder resist or resin is coated only on an area exposed by a mask for selectively exposing the plurality of circuit patterns formed on the printed circuit board at a predetermined interval or on the via hole or the through hole.

7. The method of claim 2, wherein the solder resist or resin is plugged into the at least one of the via holes by moving the squeegee to be abutted directly on an upper surface of the at least one of the via holes.

8. The method of claim 2, wherein the step of filling the solder resister or resin comprises:
   a first step of plugging the solder resist or resin in one portion of the at least one of the via holes by moving the squeegee to be abutted on the upper surface of the at least one of the first circuit patterns; and
   a second step of completely plugging the solder resist or resin in the whole portion of the at least one of the via holes by moving the squeegee under the condition of being abutted on the upper surface of the at least one of the first circuit patterns.

9. The method of claim 8, wherein in the second plugging step the solder resist or resin is plugged in the at least one of the via holes by moving the squeegee in an opposite direction to a moving direction of the squeegee in the first plugging step.

10. The method of claim 8, wherein in the second plugging step the solder resist or resin is plugged in the at least one of the via holes by moving the squeegee in a same direction to a moving direction of the squeegee in the first plugging step.

11. The method of claim 2, wherein the solder resist or resin is coated only on an area exposed by a mask for selectively exposing the plurality of the first circuit patterns formed on the printed circuit board at a predetermined interval or on the via holes.

12. A plugging method for a printed circuit board having a plurality of first circuit patterns formed on a surface of the board, and a plurality of second circuit patterns formed in the board, comprising the steps of:
   filling a solder resist or resin in spaces between the first circuit patterns;
   grinding the surface of the board; and
   performing a two dimensional plating on an upper surface of the first pattern;

wherein the solder resist or resin is plugged into the spaces by moving the squeegee under the condition of being abutted directly on the upper surface of the spaces.

13. A plugging method for a printed circuit board having a plurality of first circuit patterns formed on a surface of the board, and a plurality of second circuit patterns formed in the board, comprising the steps of:
   filling a solder resist or resin in spaces between the first circuit patterns;
   grinding the surface of the board; and
   performing a two dimensional plating on an upper surface of the first pattern;
   wherein the solder resist or resin filled in the spaces among the surface side circuit patterns is filled to substantially the same height as the upper surface of the circuit patterns.

14. A method for manufacturing a printed circuit board having a plurality of first circuit patterns formed on a surface of the board and a plurality of second circuit patterns formed within the board, and a plurality of via holes for electrically connecting the first circuit patterns and the corresponding second circuit patterns, comprising the step of:
   filling a solder resist or resin in at least one of the via holes by moving a squeegee to be abutted directly on an upper surface of at least one of the first circuit patterns corresponding to the at least one of the via holes,
   wherein the solder resist or resin filled in the at least one of the via holes is filled to substantially the same height as the upper surface of the first circuit patterns.

15. A plugging method for a printed circuit board having a plurality of circuit patterns formed on a surface of the board, comprising:
   filling a solder resist or resin in a space between two adjacent circuit patterns by moving a squeegee to be abutted directly on an upper surface of at least one of the two adjacent circuit patterns;
   grinding the surface of the board; and
   performing a two dimensional plating on an upper surface of at least one of the circuit patterns.

16. The method of claim 15, wherein the two dimensional plating is a gold plating.

17. A method for manufacturing a printed circuit board having a plurality of first circuit patterns formed on a surface of the board and a plurality of second circuit patterns formed within the board, and a plurality of via holes for electrically connecting the first circuit patterns and the corresponding second circuit patterns, comprising:
   filling a solder resist or resin in at least one of the via holes by moving a squeegee to be abutted directly on an upper surface of at least one of the first circuit patterns corresponding to the at least one of the via holes;
   grinding the surface of the board and exposing an upper surface of at least one of the first circuit patterns formed on the surface of the board; and
   performing a two dimensional plating on the exposed upper surface of the at least one of the first circuit patterns formed on the surface of the board.

18. The method of claim 17, wherein the two dimensional plating is a gold plating.

* * * * *